United States Patent [19]

Scheuerlein

[11] Patent Number: 5,793,697
[45] Date of Patent: Aug. 11, 1998

[54] READ CIRCUIT FOR MAGNETIC MEMORY ARRAY USING MAGNETIC TUNNEL JUNCTION DEVICES

[75] Inventor: Roy Edwin Scheuerlein, Cupertino, Calif.

[73] Assignee: International Business Machines Corporation, Armonk, N.Y.

[21] Appl. No.: 801,271

[22] Filed: Feb. 18, 1997

Related U.S. Application Data

[63] Continuation of Ser. No. 618,004, Mar. 18, 1996, Pat. No. 5,640,343.

[51] Int. Cl.$^6$ .................................................. G11C 13/00
[52] U.S. Cl. ..................... 365/230.07; 365/66; 365/171
[58] Field of Search ............................... 365/66, 171, 33, 365/230.07

[56] References Cited

U.S. PATENT DOCUMENTS

| | | | |
|---|---|---|---|
| 3,037,199 | 5/1962 | Grant | 365/170 |
| 3,846,769 | 11/1974 | Shepherd | 365/230.07 |
| 4,722,073 | 1/1988 | Lampe et al. | 365/87 |
| 4,860,254 | 8/1989 | Potty et al. | 365/145 |
| 4,887,236 | 12/1989 | Schloemann | 365/173 |
| 5,025,416 | 6/1991 | Prinz | 365/170 |
| 5,039,655 | 8/1991 | Pisharody | 505/1 |
| 5,055,158 | 10/1991 | Gallagher et al. | 156/643 |
| 5,173,873 | 12/1992 | Wu et al. | 365/173 |
| 5,276,639 | 1/1994 | Inoue | 365/162 |
| 5,329,486 | 7/1994 | Lage | 365/145 |
| 5,343,422 | 8/1994 | Kung et al. | 365/173 |
| 5,347,485 | 9/1994 | Taguchi et al. | 365/171 |
| 5,361,226 | 11/1994 | Taguchi et al. | 365/171 |
| 5,432,734 | 7/1995 | Kawano et al. | 365/158 |
| 5,448,515 | 9/1995 | Fukami et al. | 365/171 |
| 5,449,935 | 9/1995 | Nakamura | 257/295 |

FOREIGN PATENT DOCUMENTS

| | | | |
|---|---|---|---|
| 2 148 635 | 5/1995 | United Kingdom | G11C 11/14 |
| WO 95/10123 | 4/1995 | WIPO | H01L 43/08 |

OTHER PUBLICATIONS

J.M. Daughton, "Magnetoresistive Memory Technology", *Thin Solid Films*, vol. 216, 1992, pp. 162–168.

G.R. Harp et al., "Seeded Epitaxy of Metals by Sputter Deposition", *Applied Physics Letters*, vol. 65, No. 24, Dec. 12, 1994, pp. 3063–3065.

M. Julliere, "Tunneling Between Ferromagnetic Films", *Physics Letters*, vol. 54A, No. 3, Sep. 8, 1975, pp. 225–226.

K.P. Kamper et al., "$CrO_2$–A New Half–metallic Ferromagnet!", *Physical Review Letters*, vol. 59, No. 24, Dec. 14, 1987, pp. 2788–2791.

M.B. Ketchen et al., "Sub–μm Linewidth Input Coils for Low $T_c$ Integrated Thin–film DC Superconducting Quantum Interference Devices", *Applied Physics Letters*, vol. 61, No. 3, Jul. 20, 1992, pp. 336–368.

(List continued on next page.)

*Primary Examiner*—Terrell W. Fears
*Attorney, Agent, or Firm*—Thomas R. Berthold

[57] ABSTRACT

A sensing circuit reads the magnetic state of individual memory cells making up a nonvolatile magnetic random access memory (MRAM) array. Each memory cell is a magnetic tunnel junction (MTJ) element and a diode electrically connected in series. Each MTJ is formed of a pinned ferromagnetic layer whose magnetization direction is prevented from rotating, a free ferromagnetic layer whose magnetization direction is free to rotate between states of parallel and antiparallel to the fixed magnetization of the pinned ferromagnetic layer, and an insulating tunnel barrier between and in contact with the two ferromagnetic layers. The memory cells in the array are controlled by only two lines, and the write currents to change the magnetic state of an MTJ, by use of the write currents' inherent magnetic fields to rotate the magnetization of the free layer, do not pass through the tunnel barrier layer. The magnetic state of a memory cell is read by reducing the voltage on one of the lines while the voltage on the other line is clamped.

4 Claims, 12 Drawing Sheets

OTHER PUBLICATIONS

K. Matsuyama et al., "Fabrication of Microstructured Magnetic Tunneling Valve Junction", *IEEE Transactions on Magnetics*, vol. 31, No. 6, Nov. 1995, pp. 3176–3178.

R. Meservey et al., "Spin–polarized Electron Tunneling", *Physics Reports*, vol. 238, No. 4, 1994, pp. 214–217.

T. Miyazaki et al., "Large Magnetoresistance Effect in 82Ni–Fe/Al–Al$_2$O$_3$/Co Magnetic Tunneling Junction", *Journal of Magnetism and Magnetic Materials*, vol. 98, 1991, pp. L7–L9.

T. Miyazaki et al., "Giant Magnetic Tunneling Effect in Fe/Al$_2$O$_3$/Fe Junction", *Journal of Magnetism and Magnetic Materials*, vol. 139, 1995, pp. L231–L234.

J. S. Moodera et al., "Variation of the Electron–spin Polarization in EuSe Tunnel Junctions From Zero to Near 100% in a Magnetic Field", *Physical Review Letters*, vol. 70, No. 6, Feb. 8, 1993, pp. 853–856.

J. S. Moodera et al., "Large magnetoresistance at Room Temperature in Ferromagnetic Thin Film Tunnel Junctions", *Physical Review Letters*, vol. 74, No. 16, Apr. 17, 1995, pp. 3273–3276.

S. S. P. Parkin, "Origin of Enhanced Magnetoresistance of Magnetic Multilayers: Spin–dependent Scattering From Magnetic Interface States", *Physical Review Letters*, vol. 71, No. 10, Sep. 6, 1993, pp. 1641–1644.

A.V. Pohm et al., "The Architecture of a High Performance Mass Store with GMR Memory Cells", *IEEE Transactions on Magnetics*, vol. 31, No. 6, Pt. 1, Nov. 1995, pp. 3200–3202.

K. T. M. Ranmuthu et al., "High Speed (10–20 ns) Non–volatile MRAM with Folded Storage Elements", *IEEE Transactions on Magnetics*, vol. 28, No. 5, Sep. 1992, pp. 2359–2361.

J. C. Slonczewski, "Magnetic Bubble Tunnel Detector", *IBM Technical Disclosure Bulletin*, vol. 19, No. 6, Nov. 1976, pp. 2328–2330.

J. C. Slonczewski, "Magnetic–field Tunnel–sensor", *IBM Technical Disclosure Bulletin*, vol. 19, No. 6, Nov. 1976, pp. 2331–2332.

J. C. Slonczewski, "Magnetic–barrier Current Amplifier", *IBM Technical Disclosure Bulletin*, vol. 19, No. 6, Nov. 1976, pp. 2333–2336.

C. Tsang et al., "Design, Fabrication & Testing of Spin–valve Read Heads for High Density Recording", *IEEE Transactions on Magnetics*, vol. 30, No. 6, Nov. 1994, pp. 3801–3806.

R. Wiesendanger et al., "Observation of Vacuum Tunneling of Spin–polarized Electrons with the Scanning Tunneling Microscope", *Physical Review Letters*, vol. 65, No. 2, Jul. 9, 1990, pp. 247–250.

T. Yaoi et al., "Dependence of Magnetoresistance on Temperature and Applied Voltage in a 82Ni–Fe/Al–Al$_2$O$_3$/Co Tunneling Junction", *Journal of Magnetism and Magnetic Materials*, vol. 126, 1993, pp. 430–432.

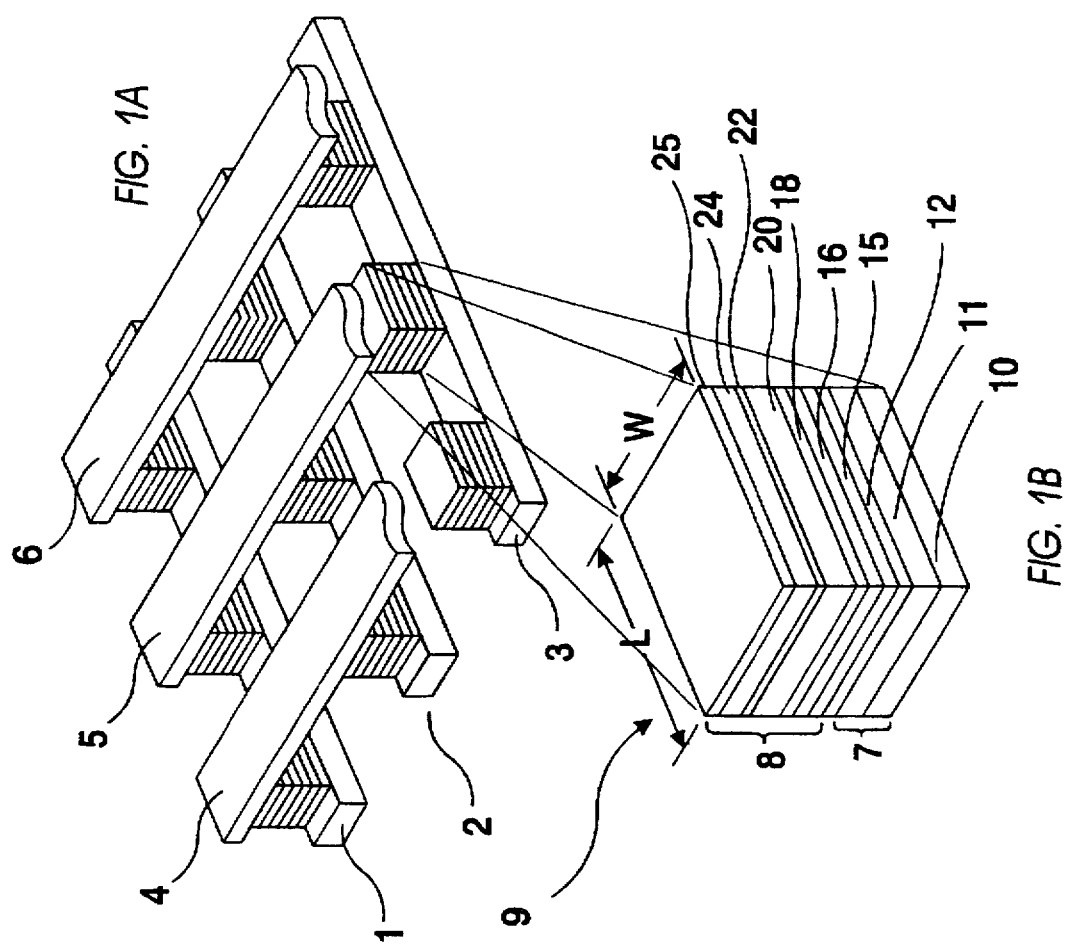

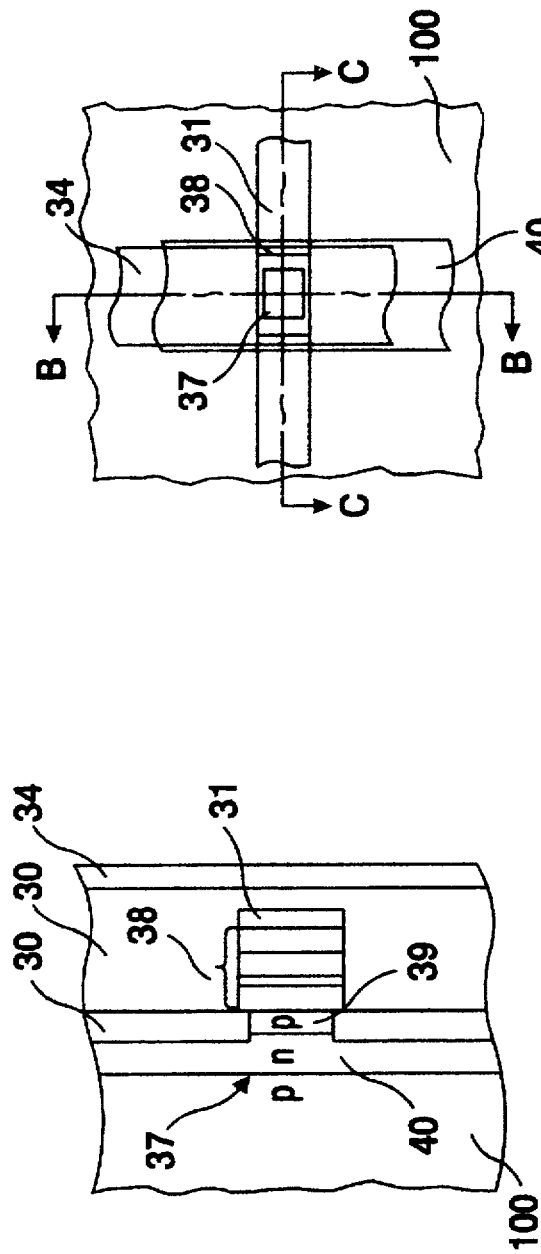
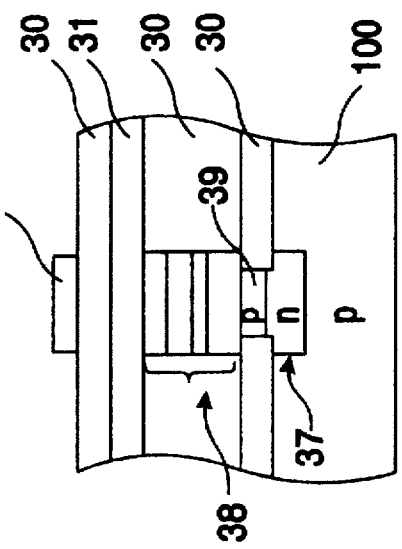
FIG. 10A
FIG. 10B
FIG. 10C

READ CIRCUIT FOR MAGNETIC MEMORY ARRAY USING MAGNETIC TUNNEL JUNCTION DEVICES This is a continuation of application Ser. No. 08/618,004 filed on Mar. 18, 1996 now U.S. Pat. No. 5,640,343.

TECHNICAL FILED

The invention relates in general to nonvolatile memory devices for use as computer main storage, and in particular to nonvolatile memory arrays that use magnetic memory elements as the individual memory cells.

BACKGROUND OF THE INVENTION

The desired characteristics of a memory cell for computer main memory are high speed, low power, nonvolatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are nonvolatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve the theoretical minimum cell area.

Unlike DRAM, magnetic memory cells that store information as the orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

In prior art MR memory cells based on the anisotropic magnetoresistive (AMR) effect, as described, for example, in Daughton, Thin Solid Films, Vol. 216, 1992, the cell resistance values are on the order of 10 to 100 Ohms using practical film materials and thicknesses. In the AMR effect, the electrical resistance of certain magnetic metals varies as the square of the cosine of the angle between the magnetization and the direction of the sense current. Because the sensing current direction through the AMR memory cell is horizontal, or in the plane of the films making up the cell, a long and narrow shape for the MR material is required to increase the resistance. Long and narrow shapes do not allow the cell to be drawn in as small an area as a DRAM cell. An alternative magnetoresistive effect, called giant magnetoresistance (GMR), which includes the "spin valve" type of GMR magnetic memory cell, also has current flow in the horizontal direction and similar resistance values. An MRAM based on spin valve GMR memory cells is described in IBM's U.S. Pat. No. 5,343,422.

For high capacity memories useful for computer main storage, a higher value of resistance is desired. A high resistance value for a magnetic memory cell is needed to reduce the sense power. Thus, the inherently low resistance of AMR and GMR memory cells, and the fact that their resistance must be increased by increasing their surface area appropriately, severely limits the use of these types of magnetic memory cells for high-density nonvolatile storage.

AMR and GMR memory cells also have power inefficiency due to the arrangement of the individual memory cell elements into an array. MRAM devices using AMR and GMR memory cells are organized as a series connection of many cells through which the sense current flows. When one memory cell in the series path is being sensed, the current flows through many other cells. This reduces the efficiency of the sensing process in two ways. First, sensing the value of the resistance of the selected cell is more difficult due to the series resistance of the many other cells in the sense path. Second, sensing power is higher due to the power dissipated in the many other cells in the sense path. Power efficiency is needed for high-capacity MRAM useful for computer main storage. Thus, the sensing inefficiencies of MRAM using AMR and GMR memory cells severely limits the use of these types of MR memory cells in high-capacity nonvolatile storage.

A magnetic tunnel junction (MTJ) is based on substantially different physical principles than AMR or GMR. In an MTJ, two ferromagnetic layers are separated by an insulating tunnel barrier and the magnetoresistance results from the spin-polarized tunneling of conduction electrons between the two ferromagnetic layers. The tunneling current depends on the relative orientation of the magnetic moments of the two ferromagnetic layers. An MTJ is described by Moodera et al. in "Large Magnetoresistance at Room Temperature in Ferromagnetic Thin Film Tunnel Junctions", Physical Review Letters, Vol. 74, No. 16, 17 April 1995, pp. 3273-3276. MTJ devices have several practical limitations that have prevented their commercialization, and no operable MRAM using MTJs has been proposed or built.

SUMMARY OF THE INVENTION

The invention is an MRAM using MTJ elements in the memory cells. Each memory cell is a magnetoresistive MTJ element and a diode in series. The memory cells are controlled by only two lines in which the write currents do not pass through the MTJ elements. All MTJ elements, diodes, and contacts are vertically arranged at the intersection regions of the two lines and between the two lines to minimize total MRAM surface area. The memory cell used in the MRAM has series resistance greater than 500 Ohms. The resistance of the MTJ can be controlled without adjusting the shape of the MTJ element. Because resistance values greater than 500 Ohms are used in the memory cells, the power expended to sense the state of a memory cell can be much lower than in prior art memory cells. This value of resistance is achieved in very small area MTJ elements by increasing the thickness or electrical barrier height of the tunneling barrier layer. The power expended to sense the memory cell's state is reduced by increasing the resistance of the MTJ and by directing the sensing current through a single memory cell.

The MRAM controls the memory cell with just two lines, the minimum needed to locate a cell in a two-dimensional array, and arranges all the elements of the memory cell vertically between the two intersecting lines. In addition, the sense current flows vertically through only one memory cell. This results in a compact arrangement for the MRAM that allows a much denser array than conventional DRAMs.

The magnetoresistive memory cell of the present invention incorporates a magnetic tunnel junction (MTJ) resistive element and a diode, has a small cell size not limited by the value of the cell resistance, and has a sense current which passes through a single MTJ resistive element, and therefore avoids the limitations of previous magnetoresistive memory cells. The memory cell used in the MRAM of the present invention is also compatible with very large scale integration (VLSI) silicon technology so associated circuits, such as a microprocessor, can be efficiently fabricated on the same substrate.

For a fuller understanding of the nature and advantages of the present invention, reference should be made to the following detailed description taken together with the accompanying figures.

BRIEF DESCRIPTION OF THE DRAWING

FIG. 1A illustrates the MRAM with magnetic memory cells located vertically between bit and word lines.

FIG. 1B is an enlarged view of one of the memory cells shown in FIG. 1A.

FIGS. 10A–10C illustrate an alternative embodiment of a memory cell usable with the MRAM.

DESCRIPTION OF THE PREFERRED EMBODIMENTS

Figure 1C:
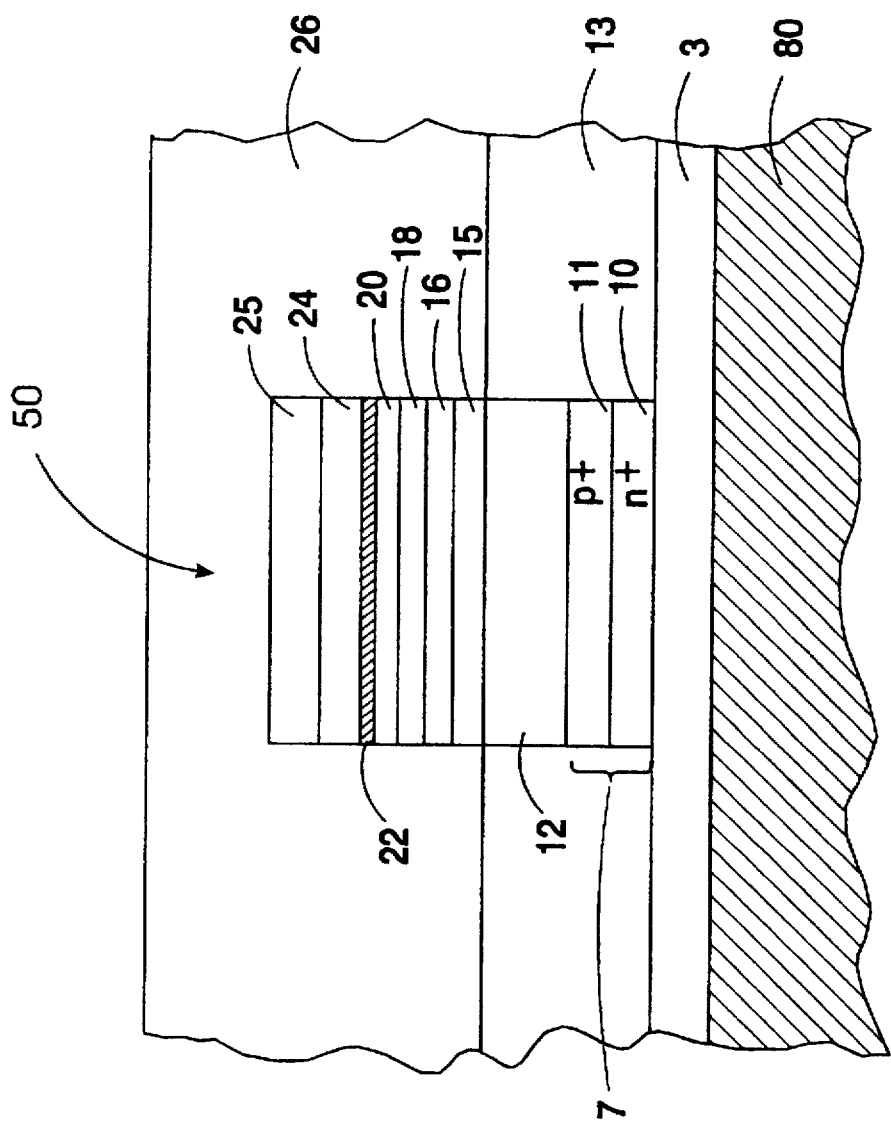
FIG. 1C is a cross-sectional view of a memory cell formed on a substrate and illustrating the fabrication process steps.

The MRAM array of magnetoresistive memory cells in a first embodiment is described with reference to FIG. 1A. The array includes a set of electrically conductive traces that function as parallel word lines 1, 2, and 3 in a horizontal plane, and a set of electrically conductive traces that function as parallel bit lines 4, 5, and 6 in another horizontal plane. The bit lines are oriented in a different direction, preferably at right angles to the word lines, so that the two sets of lines intersect when viewed from above. A memory cell, such as typical memory cell 9 shown in detail in FIG. 1B, is located at each crossing point of the word lines and bit lines in the intersection region vertically spaced between the lines. Three word lines and three bit lines are illustrated in FIG. 1A, but the number of lines would typically be much larger. The memory cell 9 is arranged in a vertical stack and includes a diode 7 and a magnetic tunnel junction (MTJ) 8. During operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1A, the array is formed on a substrate, such as a silicon substrate on which there would be other circuitry. Also, a layer of insulative material is located between the bit lines and word lines at regions of the MRAM other than the intersecting regions.

The Memory Cell

The structure of the memory cell 9 is described in more detail with reference to FIG. 1B. The memory cell 9 is formed on and in contact with a word line 3 (FIG. 1A). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a tungsten stud 12. The diode's n-type silicon layer 10 is connected to word line 3.

The MTJ 8 is formed of a series of layers of material stacked one on top of the other. The MTJ 8 in the preferred embodiment comprises a template layer 15, such as Pt, an initial ferromagnetic layer 16, such as permalloy (Ni—Fe), an antiferromagnetic layer (AF) 18, such as Mn—Fe, a fixed ferromagnetic layer (FMF) 20, such as Co—Fe or permalloy, a thin tunneling barrier layer 22 of alumina ($Al_2O_3$), a soft ferromagnetic layer (FMS) 24, such as a sandwich of thin Co—Fe with permalloy, and a contact layer 25, such as Pt.

The FMS layer is fabricated to have a preferred axis for the direction of magnetization called the easy axis. There are two possible directions of magnetization of the FMS layer along this easy axis which defines the two states of the memory cell. In contrast, the FMF layer is fabricated to have only one preferred direction of magnetization, called its unidirectional anisotropy direction, and this direction is parallel to the easy axis of the FMS layer. The desired easy axis for the FMS layer is set by some combination of intrinsic anisotropy, strain-induced anisotropy and shape anisotropy of the MTJ. The MTJ and FMS is made in the shape of a rectangle of length L and width W, where L is larger than W (FIG. 1B). The magnetic moment of FMS prefers to align along the direction of L.

The unidirectional anisotropy direction of the FMF layer is set by growing the Fe—Mn AF layer 18 on the initial ferromagnetic layer 16, which is itself grown on the template layer 15, such as Pt or Cu or Ta. The template layer 15 induces a 111 crystallographic texture in the initial ferromagnetic layer 16. These layers are deposited in a magnetic field directed parallel to the desired easy axis of FMS, creating the desired intrinsic unidirectional anisotropy direction of FMF. Alternatively, the AF layer can be deposited on the template layer in a sufficiently large magnetic field parallel to the said easy axis while heating the substrate to a temperature higher than the blocking temperature of the AF material. In this alternative, the initial ferromagnetic layer 16 is not required. It is also possible to take advantage of the magnetostriction of the FMF layer to develop, during processing, a magnetic anisotropy which aligns magnetization along the applied magnetic field direction during deposition.

Because of exchange coupling between the FMF and AF layers, the magnetization direction of the FMF layer is more difficult to change than that of FMS. In the range of fields applied by currents through the bit and word lines, the magnetization direction of FMF is fixed or pinned. Shape anisotropy of layer FMF, which follows the shape anisotropy of the MTJ, provides additional stability of the magnetization direction of the FMF layer. The magnetic fields applied to write the memory cell are large enough to reverse the direction of magnetization of FMS, but not the direction of FMF. Thus, the magnetization of FMF does not change direction during operation of the memory cells in the MRAM. Alternatively, the fixed direction of magnetization of the FMF layer can be provided by using materials in the FMF layer that have a higher coercivity than the materials in the FMS layer. Alternatively, this magnetization stability of the FMF layer can be provided by forming the FMF layer as a sandwich of three layers, i.e., two ferromagnetic films, such as Co or Co—Fe alloy films, separated by a thin metallic layer which results in antiferromagnetic coupling of the two ferromagnetic films. This type of laminated pinned FMF layer is described in IBM's U.S. Pat. No. 5,465,185. This has the added advantage of reducing the net magnetic moment of the FMF layer, and thus reduces the magnetostatic coupling of neighboring magnetic elements in the memory array, as well as the magnetostatic coupling between the FMF and FMS layers.

The properties of the FMS layer are chosen with regard to desired writing field and stability of the memory cell against field excursions, and desired value of magnetoresistance. Ni—Fe alloy layers respond to the smallest switching fields but provide lower magnetoresistance ($\Delta R/R$), and therefore lower output signal. Co—Fe alloys require higher switching fields but have higher $\Delta R/R$ and greater stability against field excursions. Co—Fe layers also have greater magnetostriction which may be utilized to set the uniaxial anisotropy, but may also lead to nonuniform properties in the patterned arrays. Improved corrosion resistance can be obtained by adding Cr to the Co or Co—Fe layer. A preferred FMS layer is comprised of a thin Co—Fe layer in contact with the $Al_2O_3$ tunnel barrier layer 22, for large $\Delta R/R$, and a thicker layer of low magnetostriction magnetic material, such as Ni—Fe, to make up the bulk of the FMS layer.

The properties of the FMF layer are chosen with regard to desired stability against field excursions and desired value of magnetoresistance. Ni—Fe alloys display greater stability with Fe—Mn antiferromagnetic layers because of their higher unidirectional exchange anisotropy as compared to Co—Fe alloy layers. However, Co—Fe alloys provide higher magnetoresistance.

The AF layer could also be formed of a Ni—Mn layer, or an electrically conducting antiferromagnetic oxide layer, such as doped NiO or CoO, which exchange biases the FMF layer.

Fabrication Process for the Memory Cell

The preferred materials, thicknesses, and process steps of the MTJ 8 are described with reference to FIG. 1C. On a silicon wafer substrate 80, word lines 3 and silicon diodes of regions 10 and 11 are formed and covered with an insulating layer 13 of $SiO_2$. The surface on which the MTJ 8 is formed is planarized after forming a tungsten stud 12 in a via of insulator 13. The tungsten stud 12 contacts diode layer 11. The surface of insulator 13 and tungsten stud 12 is planarized by a chemical-mechanical polishing of insulator 13. Next, the series of layers which make up the MTJ 8 are deposited by magnetron sputter deposition uniformly on this surface which is held near ambient temperature. In order, a 10 nm thick Pt layer 15, a 4 nm thick $Ni_{81}Fe_{19}$ alloy layer 16, a 10 nm thick $Mn_{54}Fe_{46}$ alloy layer 18, and an 8 nm thick $Ni_{81}Fe_{19}$ alloy FMF layer 20 are deposited. On top of FMF layer 20, 1–2 nm of Al is deposited and oxidized at an oxygen pressure of 100 mTorr and a power density of 25 W/cm$^2$ for 60 to 240 seconds to form the insulating tunnel barrier layer 22 of $Al_2O_3$. Then a soft ferromagnetic layer FMS 24 is formed. The FMS layer 24 comprises 2 nm of Co—Fe alloy, 20 nm of $Ni_{81}Fe_{19}$ alloy, and a 10 nm thick Pt layer 25. At this point, there is a single large MTJ that covers the entire surface of insulator 13 on the substrate 80. This large MTJ is then patterned into many small MTJs, such as MTJ 8, by photoresist masking and Ar ion milling down through the stack of layers to the surface of $SiO_2$ insulator layer 13. The individual MTJs are then covered with a thick layer 26 of $SiO_2$. State-of-the-art silicon VLSI processes are then used to open contact holes in insulator 26 to the top of the MTJs 8. Bit lines (not shown) are then formed on top of the structure using electromigration-resistant thin film materials of state-of-the-art silicon VLSI processing, such as Al—Cu alloys, Cu, or W wiring materials. The bit lines contact layer 25 of MTJ 8.

Controlling MTJ Resistance

The MTJ 8 changes resistance when the direction of magnetization of the FMS layer 24 switches from being parallel to being antiparallel to the magnetization direction of FMF layer 20. As will be explained, this occurs as a result of magnetic fields generated when current is passed through the bit and word lines. The resistance of the MTJ 8 is strongly dependent on the thickness of the tunneling barrier layer 22, its electronic barrier height, and the layer material properties, such as the surface smoothness of the lower layers. The resistance of the MTJ 8 is less strongly dependent on the planar surface area of the tunneling barrier layer 22 and varies inversely with this area. Therefore, the resistance of MTJ 8 can be adjusted to the value desired for the operation of the memory circuitry without adjusting its surface area. The effective resistance of the diode 7 is dependent on the planar area of the diode and the current level through it. In particular, the sense current for a memory cell of several thousand Ohms resistance is on the order of 100 microamps. This level of sense current biases diodes of submicron size to a low enough effective resistance so that the diode resistance is on the order of the resistance of the MTJ, and thus does not seriously interfere with sensing the change in resistance of the MTJ. The area dependence of the diode's resistance is similar to the area dependence of the MTJ's resistance, so the two will scale similarly if the area of the memory cell is changed.

Operation of the Memory Cells and the MRAM

When a sufficiently large current is passed through both a write line and a bit line of the MRAM, the self-field of the combined current at the intersection of the write and bit lines will rotate the magnetization of free FMS ferromagnetic layer of the single particular MTJ located at the intersection of the energized write and bit lines. The current levels are designed so that the combined self-field exceeds the switching field of the free FMS ferromagnetic layer. This is predominantly determined by the coercivity and the magnetic anisotropy of the free FMS ferromagnetic layer. This self-field is designed to be much smaller than the field required to rotate the magnetization of the pinned FNF ferromagnetic layer. The cell array architecture is designed so that the write currents do not pass through the MTJ itself. The memory cell is read by passing a sense current perpendicularly through the diode and MTJ from the pinned FMF ferromagnetic layer through the tunnel junction barrier to the free FMS ferromagnetic layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing Al₂O₃ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free FMS and the pinned FMF ferromagnetic layers. The tunneling current is spin polarized, which means that the electrical current passing from one of the ferromagnetic layers, for example, the pinned FMF layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the cell depends on both the spin polarization of the electrical current and the electronic states in both of the ferromagnetic layers. As a result, the two possible magnetization directions of the FMS uniquely define two possible bit states (0 or 1) of the memory cell.

The operation of the MRAM to read and write to individual memory cells will be described with reference to FIG. 2. Only the bit lines 4, 5, 6 and the word lines 1, 2, 3 are required to read and write. No other control lines from outside the array are necessary to read or write the memory state of the memory cells. This provides a very efficient memory array.

Write Operation

Figure 2:
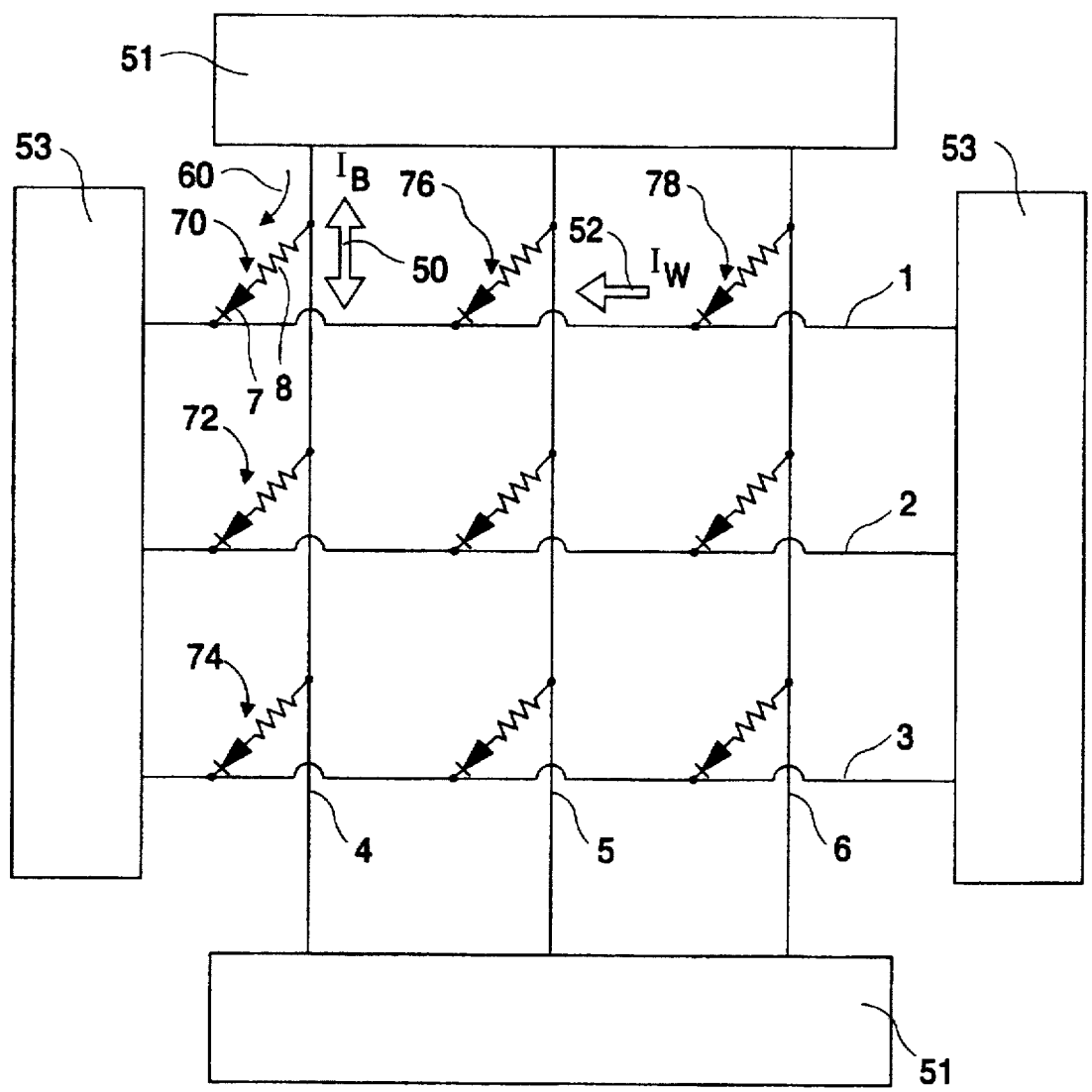
FIG. 2 is a schematic of the MRAM illustrating the read and write operations.

As shown in FIG. 2, a selected cell 70 is written by passing current $I_b$, shown by arrow 50, through bit line 4 and current $I_w$, shown by arrow 52, through word line 1. Bit line control circuitry 51 is attached to the bit lines and controls $I_b$. Word line control circuitry 53 is attached to the word lines and controls $I_w$. The magnetic field produced by either $I_b$ or $I_w$ alone in the region of the cells is less than the magnetic field required to change the magnetic state in a cell, so half-selected cells 72, 74, 76, 78 (those over which only $I_b$ or $I_w$ alone is passing) are not written. However, the combination of magnetic fields from $I_b$ and $I_w$ is sufficient to change the state of selected memory cell 70. At least one of the currents $I_b$ or $I_w$ has to be reversible to write the two different magnetic states of the cell 70. The bit lines 4, 5, 6 are chosen to have bidirectional currents and also to be connected to the sensing circuitry, which is part of bit line control circuitry 51, so only the bit line control circuitry has to connect to an external data path. The external data path is advantageously connected to only one edge of a memory array to avoid the wire length needed to reach a second edge. The array shown in FIG. 2 has only one selected cell 70, but any cell along the word line 1 could be the selected cell, or multiple cells along the word line could be selected by energizing more than one bit line.

Figure 3:
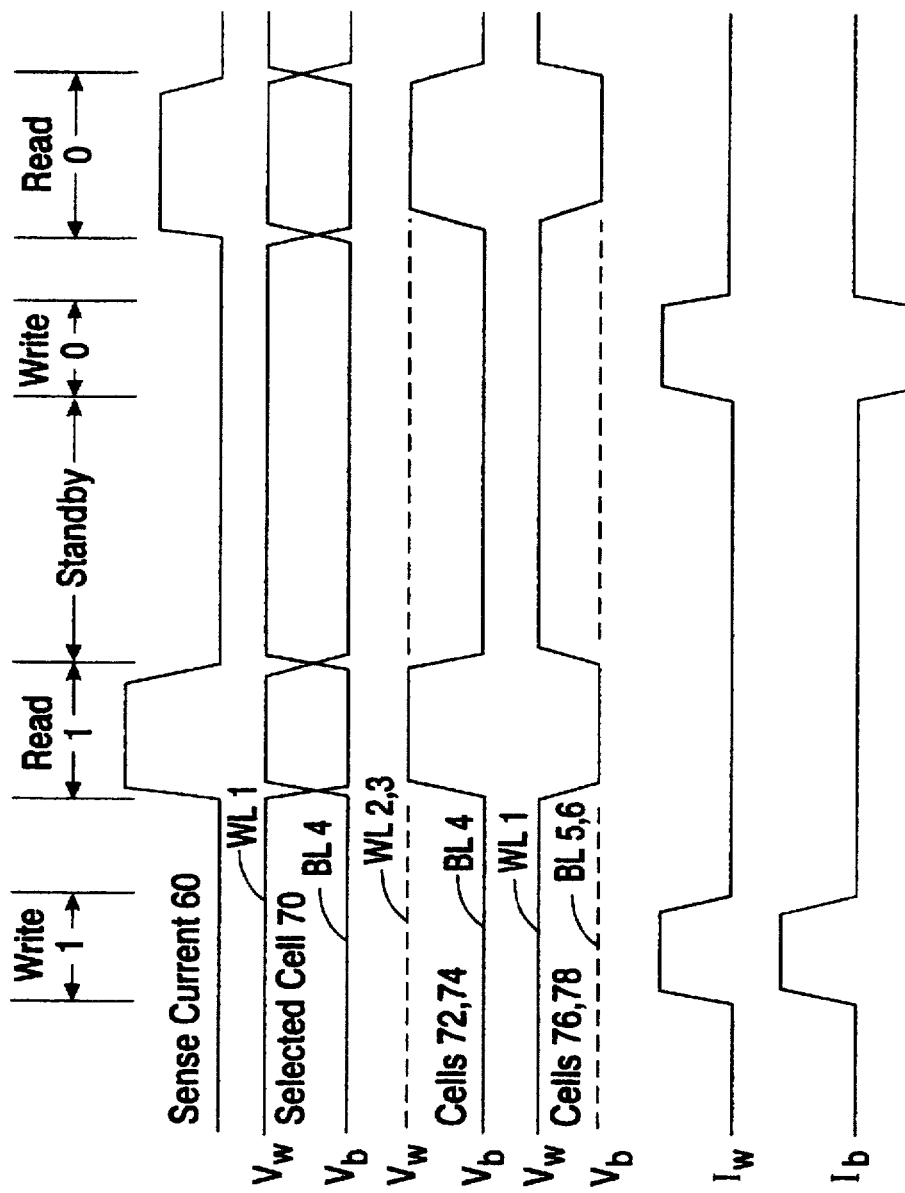
FIG. 3 illustrates the voltage and current levels on the bit and word lines during MRAM read and write operations.

Referring now to FIG. 3, the voltage level of the bit lines 4, 5, 6 during a write operation is near a voltage $V_b$, for convenience in providing for the bidirectional currents. The voltage level of the word lines 1, 2, 3 is near a more positive voltage $V_w$. The voltage levels are selected to ensure that all diodes in the array are reverse biased so that the currents $I_b$ and $I_w$ do not flow vertically through any memory cell.

In the standby state, the word lines are at $V_w$ and the bit lines are at $V_b$, so the array is prepared to begin a write operation as described above or a read operation as described below.

Read Operation

Referring again to FIG. 3, in a read operation a forward bias voltage is established across the selected cell 70 by pulling the word line 1 voltage down, and raising the bit line 4 voltage. The forward bias voltage is the sum of the diode 7 voltage and the voltage across the MTJ 8 under a read condition. During a read, unselected bit lines 5, 6 remain at the standby voltage level $V_b$, and unselected word lines 2, 3 remain at the standby voltage level $V_w$. Selected bit line 4 is raised to $V_w$ and selected word line 1 is pulled down to $V_b$, to create the forward bias voltage across the selected cell 70. Half-selected cells have zero voltage drop from word line to bit line and do not conduct.

The resistance of the selected memory cell 70 determines the sense current 60 that flows from the bit line 4 through the selected memory cell 70 to the word line 1. In the sense circuitry forming part of circuitry 51, this current is compared to a reference current set to a value halfway between the expected values for the two possible states of the memory cell and the difference is amplified to read the data stored in selected cell 70. As shown by the sense current 60 waveform in FIG. 3, the sense current 60 has two discrete values corresponding to the two magnetic states of the MTJ, which correspond to a data 1 or 0. After the data is read, the voltage on bit line 4 and word line 1 are returned to their respective standby values. The magnetic state of memory cell 70 remains unchanged after the read operation.

Read Sensing Technique and Circuit

Figure 4:
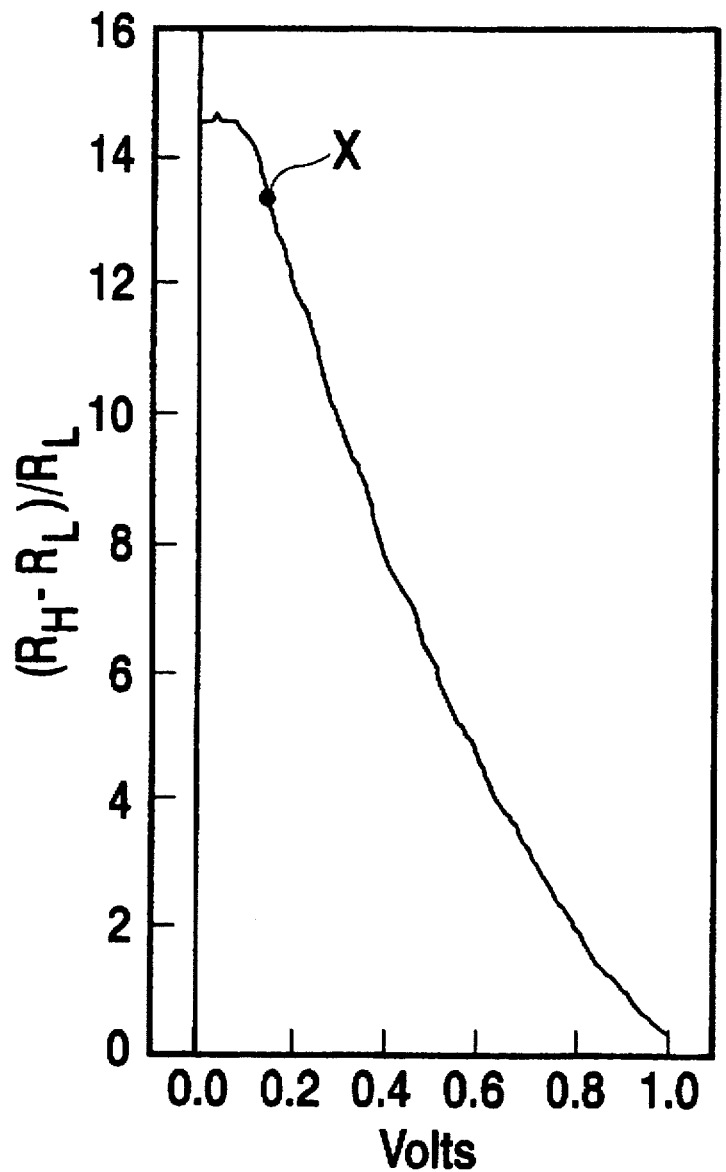
FIG. 4 is a graph of magnetoresistance as a function of voltage for a MTJ.
Figure 6:
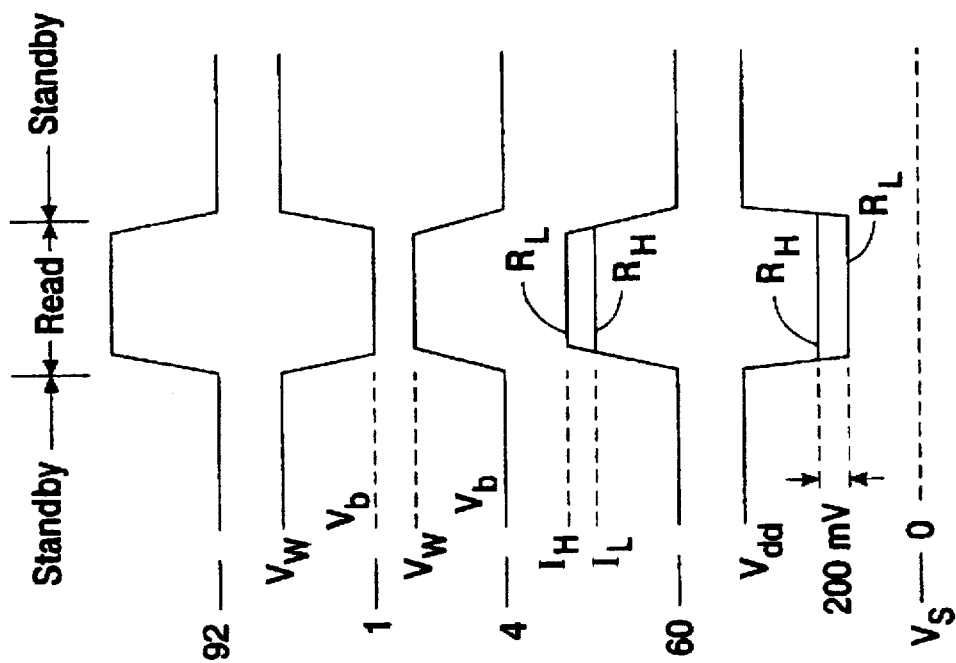
FIG. 6 is a set of voltage and current waveforms corresponding to various nodes and components of the circuit of FIG. 5 during a read operation.

The preferred technique for sensing the resistance of a selected memory cell in the MRAM will be explained with respect to FIGS. 4–7. The MTJ element 8 has two stable magnetic states, which correspond to the two parallel/antiparallel magnetization orientations of the free ferromagnetic layer in the MTJ. These two stable magnetic states cause two different values of resistance to current passing through the tunnel barrier of the MTJ. The memory state of the memory cell is detected or read by passing a current through the MTJ and diode and measuring the voltage across the MTJ. MTJ elements are known to have a maximum voltage response because the magnetoresistive effect decreases as the voltage across the MTJ element increases. A graph of magnetoresistance, the change in resistance divided by the low resistance value, is shown in FIG. 4 for a typical MTJ. When the MTJ elements are in series with their respective diodes and organized into an array, there would be a reduction in read voltage across the memory cell due to the resistance of the diode in series with the MTJ element. This reduction would be by a ratio of the MTJ resistance R to the sum of R and D, where D is the resistance of the series diode.

In the preferred sensing scheme of the present invention the voltage across the MTJ element is deliberately clamped, even though in the prior art it is that voltage that is being used to read the memory cell. This provides several benefits. The sensing scheme has a far smaller degradation in efficiency of the read operation due to a series diode. It also reduces the voltage across the MTJ element to the order of 100 mV, which is near the voltage level at which the magnetoresistance for the MTJ is at its maximum value, as seen in FIG. 4. The voltage clamping also reduces the time to establish voltages on the conducting lines attached to the MTJ element because required voltage excursions are reduced. The current through the MTJ element is reduced so the power dissipated in the read operation can be reduced. The sensing scheme also provides read signal gain approximately equal to the ratio between the MTJ resistance and a load resistance supplying current to the MTJ element during reading. The sensing scheme improves the signal from an MTJ element in series with a diode by a factor about 10 to 20.

Figure 5:
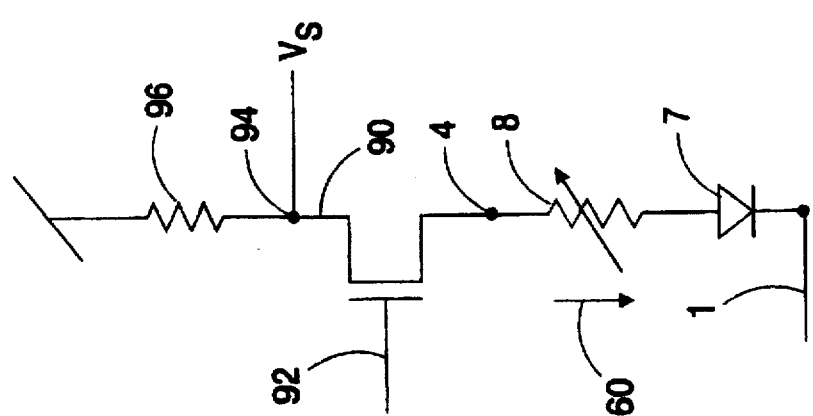
FIG. 5 is a schematic of the memory cell sensing circuit with the voltage across the MTJ clamped.

Referring now to FIG. 5, a memory cell comprises a diode 7 and a MTJ 8. The MTJ 8 has two possible low and high resistances, $R_L$ and $R_H$ respectively, depending on the magnetization direction of the free ferromagnetic layer in the MTJ. The operation of the sensing scheme to read the memory cell is described with reference to the circuit in FIG. 5 and the circuit waveforms in FIG. 6, which have corresponding reference numerals for cross reference. The state of the memory cell is sensed by reducing the voltage on the selected word line 1 to $V_b$ while the voltage on the selected bit line 4 is clamped to $V_w$. During a read operation, the bit line 4 is held near this desired voltage, which is about 100 mV more than the diode 7 voltage. The desired voltage is controlled by a voltage clamping device 90, which has a control voltage applied on its terminal 92. Voltage clamping device 90 may be a field-effect transistor. This causes a sense current 60 to flow through the clamping device 90. Sense current 60 produces a sense voltage $V_s$ at the node 94 due to the load resistor 96 which is attached to node 94 and the positive supply voltage $V_{dd}$. The low resistance state $R_L$ and high resistance state $R_H$ produce different values of sense current 60 in inverse proportion ($I_L$ corresponding to $R_H$ and $I_H$ corresponding to $R_L$) and therefore different values of output voltage $V_r$ as labeled in FIG. 6.

Since the voltage across the MTJ 8 is limited to about 100 mV, the percentage change in sense current 60 is nearly the same as the maximum magnetoresistance of the MTJ, as indicated by point X in FIG. 4. The magnetoresistance $(R_H-R_L)/R_L$ produces a percentage change in current 60, i.e., $(I_H-I_L)/I_L$ which is approximately equal to $(R_H-R_L)/(R_L+R_D)$, where $R_D$ is the slope of the current versus voltage curve of the diode, called the differential resistance. The differential resistance of the diode 7 is about 26 mV divided by the current 60, and is 10 to 20 times smaller than the resistance D of the diode. Therefore the loss in efficiency of detecting the difference in memory states is much smaller than prior art sensing schemes for MTJ devices in series with a diode. The load resistor 96 is chosen to be substantially larger than the resistance of MTJ 8 to provide voltage gain. A ratio of 10 is used in FIG. 6. For $R_L$ approximately equal to 5 kOhms, a load resistance of about 50 kOhms, and a sense current 60 of approximately 20 microamps, the change in output voltage $V_s$ is about 200 mV. The output voltage $V_s$ is compared to a reference voltage level and the difference amplified to provide full logic levels, by use of well known circuit techniques.

Although a linear load resistor 96 is used in the embodiment of FIG. 5, the load resistor could be implemented as a field effect device circuit or a bipolar transistor circuit as is well known in circuit design.

Figure 7:
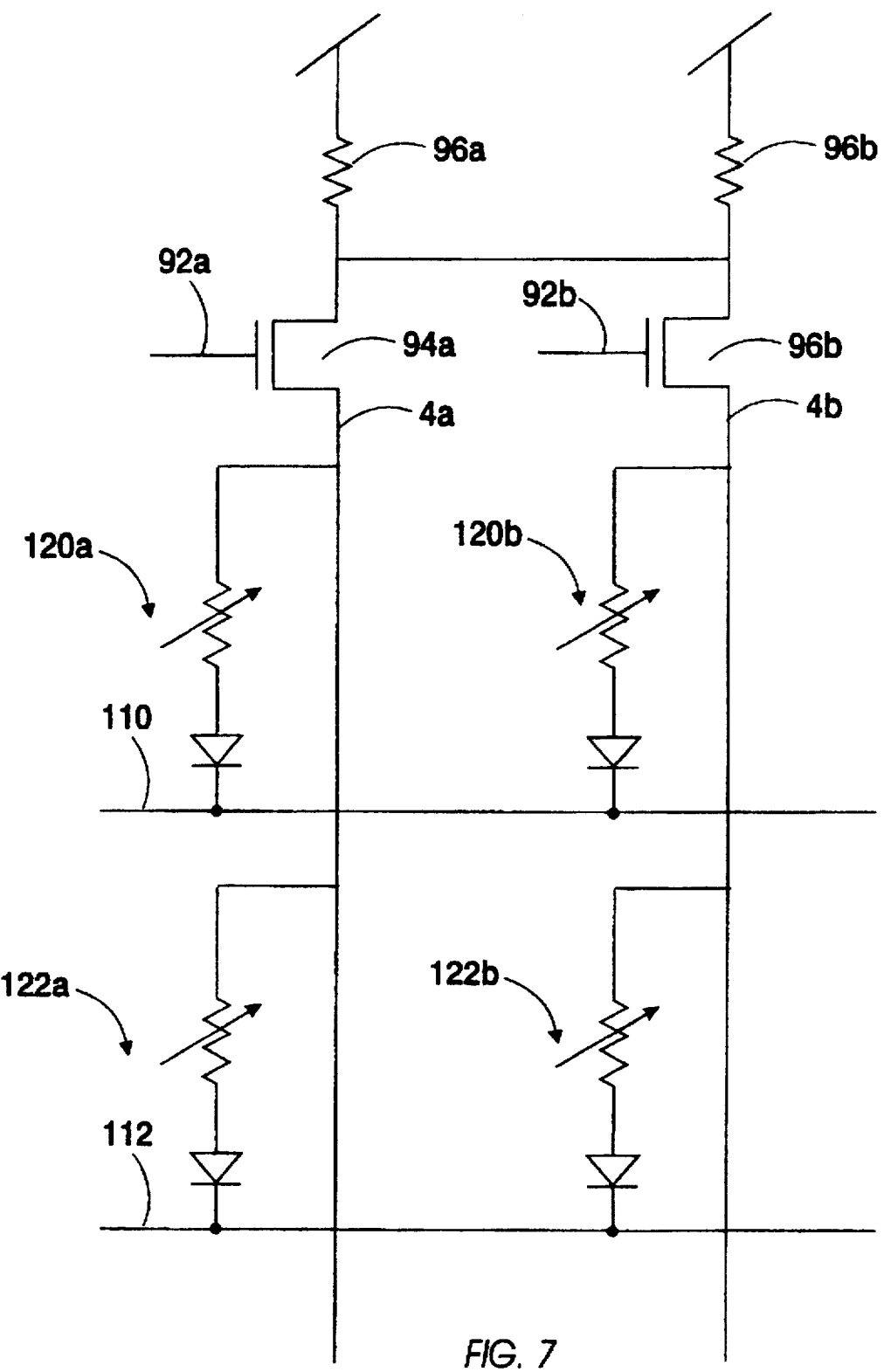
FIG. 7 is a first alternative embodiment of the MRAM with the use of voltage clamping during a read operation.

An alternative sensing technique and circuit for an array of memory cells will be described with reference to FIG. 7. An array of four memory cells is shown for example, although typically many more cells would be constructed. A column of cells 120a and 122a are connected by a conductor 4a to a first voltage limiting device 94a, which is connected to load resistance 96a. A second column of cells 120b and 122b are connected by a second conductor 4b to a second voltage limiting device 94b, which is connected to a second load resistance 96b. A first selection line 110 is connected to the diodes in the row of cells 120a and 120b. A second selection line 112 is connected to the diodes in a second row of cells 122a and 122b. One or more cells in a row is read at a given time. A selection line 110 is brought to ground while one or more of control gates 92a, 92b is raised to a positive control voltage which clamps the conductor 4a or 4b, respectively, to a voltage about 100 mV more than one diode drop above $V_b$. The one or more cells 120a, 120b associated with the one or more control gates 92a, 92b are read in the manner as described above for FIG. 5.

Figure 8:
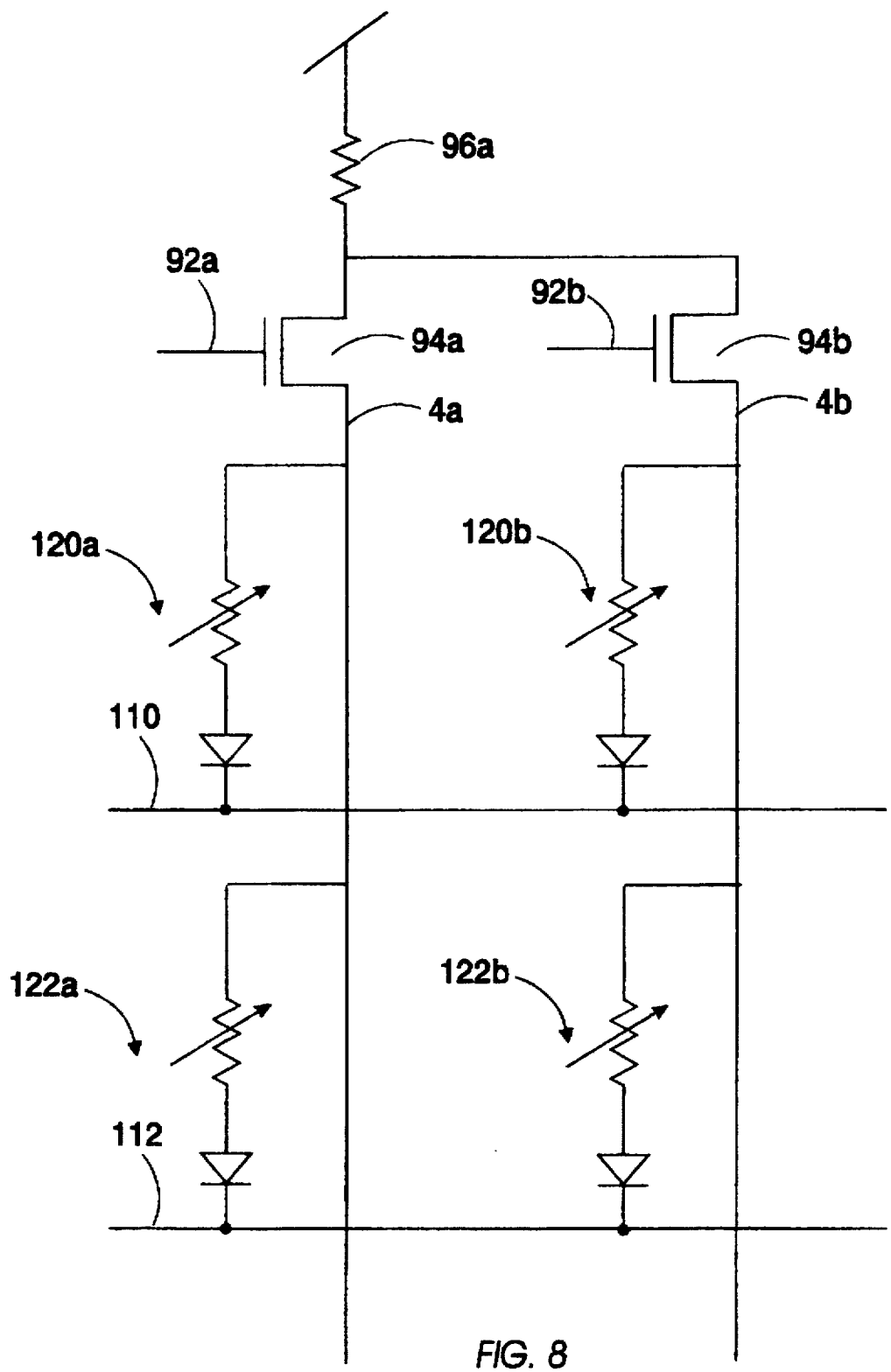
FIG. 8 is a second alternative embodiment of the MRAM with the use of voltage clamping during a read operation.

Another embodiment will be described with reference to FIG. 8. An array of four memory cells is shown for example, although typically many more cells would be constructed by duplicating the column unit to increase in one direction, and duplicating the row unit to increase in the other direction. A column of cells 120a and 122a are connected by a conductor 4a to a first voltage limiting device 94a, which is connected to load resistance 96a. A second column of cells 120b and 122b are connected by a second conductor 4b to a second voltage limiting device 94b, which is connected to load resistance 96a. A first selection line 110 is connected to the diodes in the row of cells 120a and 120b. A second selection line 112 is connected to the diodes in a second row of cells 122a and 122b. Only one of the cells in a column unit is read at a given time. A selection line 110 is brought to ground while only one of control gates 92a, 92b is raised to a positive control voltage which clamps the conductor 4a or 4b, respectively, to a voltage about 100 mV more than one diode drop above $V_b$. The cell 120a or 120b associated with one of the control gates 92a, 92b, respectively, is read in the manner as described above for FIG. 4. This embodiment reduces the number of support circuits required for amplifying the output voltage.

Alternative Embodiments

The diode in the memory cell functions as a unidirectional current valve. Thus any such diode-like device can be used in place of the preferred silicon junction diode. In an alternative embodiment, the memory cell uses a Schottky barrier diode in place of a silicon junction diode. The Schottky barrier diode comprises an n-type silicon layer and a metal layer, such as Pt, Ti, or W. The remaining parts of the memory array are the same as the corresponding parts in FIG. 1A. The voltage swing for the word lines and bits lines are reduced for Schottky diodes with a lower diode voltage than silicon junction diodes, such as Ti on n+silicon. Also, the charge storage effects are smaller for Schottky diodes, which decreases the time to complete a read operation.

In another embodiment, the soft free ferromagnetic layer FMS is on the bottom of the MTJ, closest to the diode, and the fixed ferromagnetic layer FMF is on top. Then the initial ferromagnetic layer (layer 16 in FIGS. 1B and 1C) is not required. The layers for the MTJ could be, for example, 10 nm of Pt, 20 nm of Ni—Fe, 2 nm of Co—Fe, $Al_2O_3$, 8 nm of Ni—Fe, 15 nm of Mn—Fe, and 10 nm of Pt, in similar alloy proportions and processes as used in the first embodiment.

Figure 9:
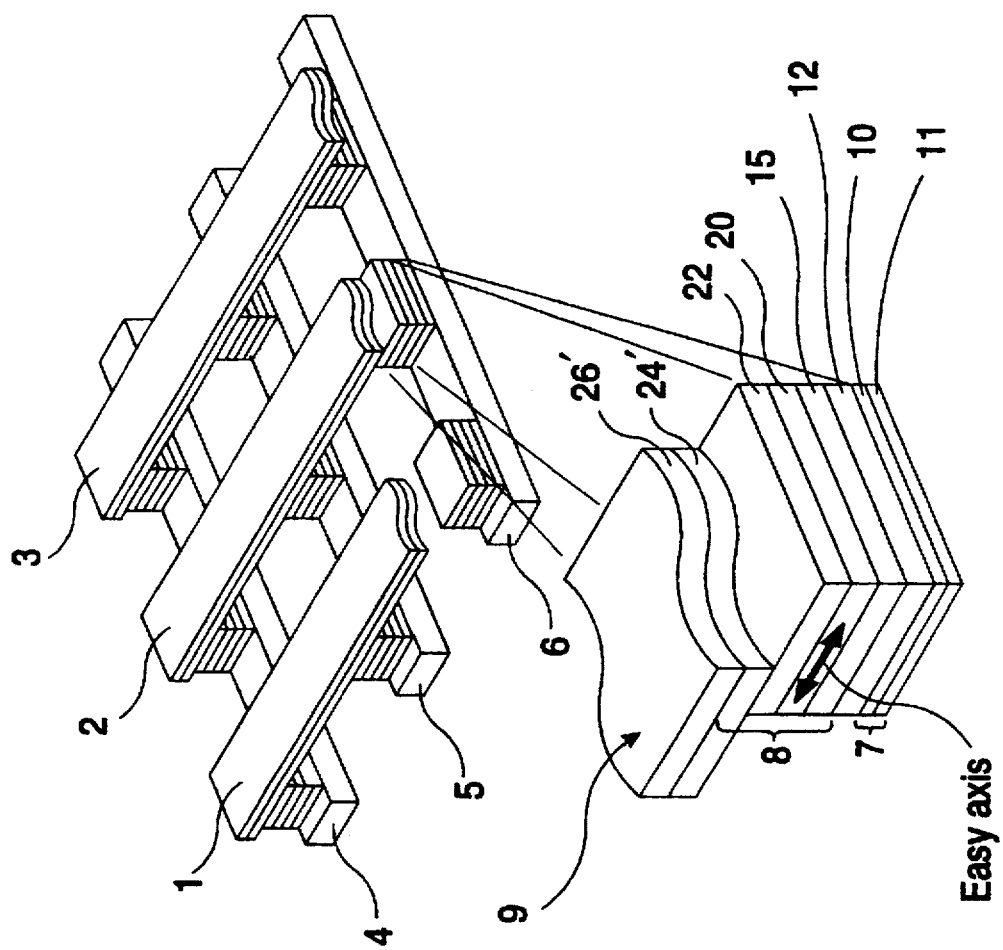
FIG. 9 illustrates an alternative embodiment of the MRAM.

In another embodiment, as illustrated in FIG. 9, the fixed ferromagnetic layer FMF 24' and the AF layer 26' of the memory cells are formed as continuous traces that also serve as the word lines 1, 2, 3 which are now on top of the MTJ element. The bit lines 4, 5, 6 are located below the MTJ element. This eliminates a layer from the structure and enhances the stability of the magnetization of the FMF layer. The easy axis of magnetization of soft ferromagnetic layer FMS 20 is established parallel to the word lines 1, 2, 3 by the techniques previously described relative to FIGS. 1A–1C. The FMS layer 20 is formed on a Pt layer 15, which is connected to the diode 7 by tungsten stud 12. The diode 7 has an n-region 10, and a p-region 11 which is connected to bit line 6. The initial ferromagnetic layer is not needed in this embodiment.

A memory cell of another embodiment uses a diode 37 formed on a semiconductor substrate 100, as illustrated in FIGS. 10A–10C. FIG. 10A is a planar top view of this memory cell, FIG. 10B is a sectional view of section B—B, and FIG. 10C is a sectional view of section C—C. High-density memory arrays require support circuits implemented in a silicon VLSI process. For efficiency, a diode 37 compatible with silicon VLSI processing is used as the memory cell diode. The word line 34 periodically contacts local word line 40, which is formed as an n-diffused region in the substrate 100. Local word line 40 is used only for reading the memory cell. Diode 37 is formed at the junction between p-diffused region 39 and the local word line 40. An MTJ 38 contacts the p-diffused region 39. Bit line 31 contacts the top of the MTJ 38. Insulating material 30 surrounds the individual memory cell.

Figure 11:
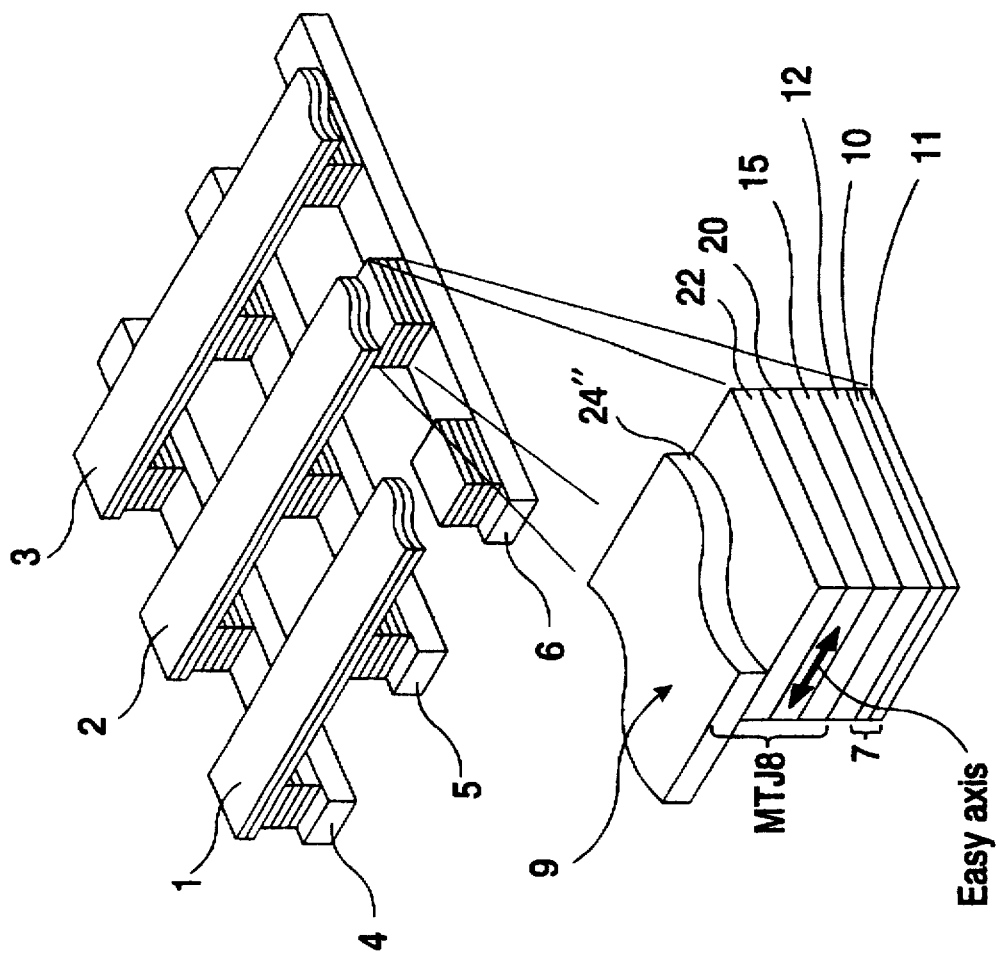
FIG. 11 illustrates a second alternative embodiment of the MRAM.

Another embodiment is illustrated in FIG. 11. Word lines 1, 2, 3 and bit lines 4, 5, 6 and diode 7 are similar to their counterparts in the embodiment of FIG. 9. The fixed ferromagnetic layer FMF 24" is formed as a continuous line and serves as part of the word lines. The FMF layer 24" has high shape anisotropy because of its length. In addition, a unidirectional anisotropy parallel to this length is created during deposition and a higher coercivity material, such as Co—Fe alloy, is used to provide greater stability. The easy axis of magnetization of the soft ferromagnetic layer FMS 20 is established parallel to the word lines 1, 2, 3. The magnetic fields applied during the writing of the memory cell are less than the fields required to change the magnetization direction of the fixed ferromagnetic layer FMF 24", but sufficient to change the magnetization of the soft ferromagnetic layer FMS 20, which is of a lower coercivity material, such as a sandwich of a thin Co—Fe layer next to the $Al_2O_3$ layer 22 and a layer of Ni—Fe comprising the bulk of the FMS layer. This memory cell has the advantage that no antiferromagnetic layer is required to pin the state of the fixed ferromagnetic layer 24".

Figure 12:
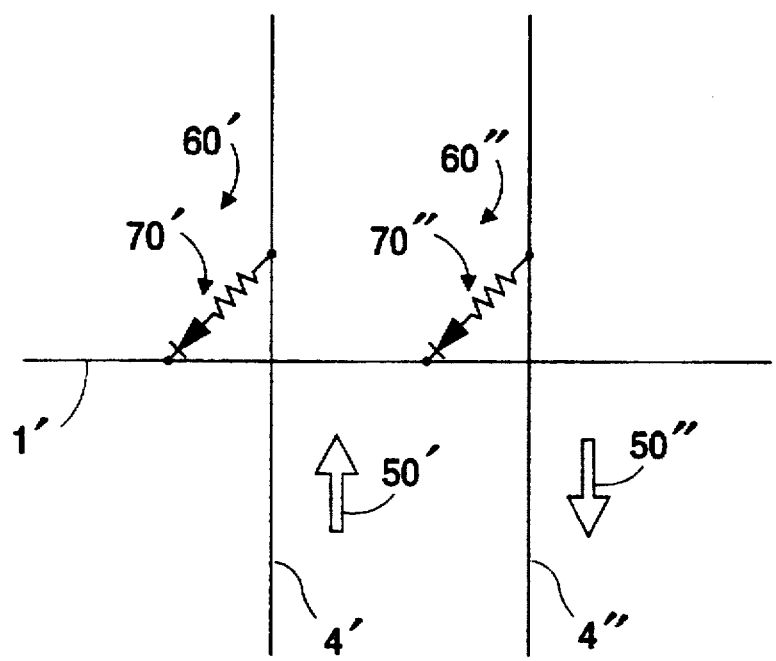
FIG. 12 illustrates a modified MRAM with two memory cells per bit.

In another embodiment as shown in FIG. 12, each bit of information in the memory array is stored in a pair of memory cells 70' and 70", which are attached to a pair of bit lines 4' and 4", but the same word line 1'. The 70', 70" cells are written to opposite states by supplying opposite polarity currents $I_b$ 50' and 50" during the write operation. The read operation is accomplished by comparing the sense currents 60' and 60". This structure has the advantage of not needing a reference current to read the memory cells.

There are variations and modifications of the embodiments described above that can also be implemented in the present invention. For example, the polarity of the memory cell diodes can be reversed by exchanging p-type and n-type materials. The polarity of applied voltages are then all reversed, but the operation of the MRAM otherwise remains the same as described in the embodiment shown in FIGS. 1A–1B. Also, the bit lines can be located below the memory cells and connected to the memory cell diodes, while the word lines are located above the memory cells and connected to the MTJs. With a polarity change of either the diode or the applied voltages, the operation of the MRAM is the same as described with reference to FIGS. 1A–1B. Also, the state of a memory cell can be sensed by forcing a predetermined fixed current through the memory cell and detecting the voltage on the bit line, with a fixed voltage applied on the word line, but this provides less efficient sensing than the sensing techniques described above.

While the preferred embodiments of the present invention have been illustrated in detail, it should be apparent that modifications and improvements may be made to the invention without departing from the spirit and scope of the invention as described in the following claims.

What is claimed is:

1. A sense circuit for reading the magnetic state of a magnetic memory cell electrically connected to first and second write lines, the magnetic state being controlled by control circuitry electrically connected to said first and second write lines, the sense circuit comprising:

a supply voltage source;

a magnetic tunnel junction including a fixed ferromagnetic layer having a magnetization in the plane of said fixed ferromagnetic layer that is fixed from rotation when exposed to a magnetic field less than a predetermined field strength, an insulating tunnel barrier layer in contact with the fixed ferromagnetic layer, and a free ferromagnetic layer in contact with the tunnel barrier layer and having a magnetization free to rotate in the plane of said free ferromagnetic layer between directions generally parallel and antiparallel to the magnetization of the fixed ferromagnetic layer when exposed to a magnetic field less than said predetermined field strength, the parallel and antiparallel magnetizations corresponding to two magnetic states of the magnetic tunnel junction;

a unidirectional current valve, the current valve and magnetic tunnel junction being electrically connected in series between the first and second write lines;

a voltage clamping device between the voltage source and the first write line for controlling the voltage of the first write line when the voltage on the second write line is reduced by the control circuitry during reading of the magnetic state of the magnetic tunnel junction; and a load resistor between the voltage source and the voltage clamping device, the voltage sensed at a node between the load resistor and the voltage clamping device being representative of the sense current flowing through the magnetic tunnel junction and thereby the magnetic state of the magnetic tunnel junction, whereby the magnetic tunnel junction is a magnetic memory cell.

2. The sense circuit according to claim 1 wherein the unidirectional current valve is a diode.

3. The sense circuit according to claim 1 wherein the voltage clamping device is a field effect transistor.

4. The sense circuit according to claim 1 further comprising:

a second magnetic tunnel junction like said first magnetic tunnel junction, the first and second magnetic tunnel junctions having opposite magnetic states;

a second unidirectional current valve, the second current valve and second magnetic tunnel junction being electrically connected in series between the second write line and a third write line;

a second voltage clamping device between the voltage source and the third write line for controlling the voltage of the third write line when the voltage on the second write line is reduced by the control circuitry during reading of the magnetic states of the two magnetic tunnel junctions; and a second load resistor between the voltage source and the second voltage clamping device; whereby the difference between the sense current through the first magnetic tunnel junction and the sense current through the second magnetic tunnel junction is representative of the magnetic states of the two magnetic tunnel junctions and the two magnetic tunnel junctions thereby function as a single memory cell.

* * * * *